United States Patent [19]

Roepers et al.

[11] Patent Number: 4,464,960
[45] Date of Patent: Aug. 14, 1984

[54] LEAD CUTTING MACHINE

[75] Inventors: Harry F. Roepers, Breda; Herman B. Van Tilburg, Oosterhout, both of Netherlands

[73] Assignee: Soltec B.V., Oosterhout, Netherlands

[21] Appl. No.: 336,163

[22] Filed: Dec. 31, 1981

[30] Foreign Application Priority Data

Oct. 29, 1980 [EP] European Pat. Off. ........ 80201027.2

[51] Int. Cl.³ ............................................ H05K 13/04
[52] U.S. Cl. ........................................ 83/104; 83/174; 83/409; 83/471.2; 83/488; 83/925 R
[58] Field of Search ................ 83/861, 872, 216, 217, 83/277, 278, 925 R, 409, 409.1, 409.2, 471.2, 486, 488, 174, 471.3, 403.1, 104; 198/580, 837, 681; 140/139, 140, 147

[56] References Cited

U.S. PATENT DOCUMENTS

| | | | |
|---|---|---|---|
| 3,079,958 | 3/1963 | Helda | 140/147 |
| 3,165,959 | 1/1965 | Eidson | 83/174 |
| 3,181,406 | 5/1965 | Sayles | 83/488 X |
| 3,263,882 | 8/1966 | Nugent et al. | 83/103 X |
| 3,307,442 | 3/1967 | Imhoff | 83/925 R X |
| 3,574,934 | 4/1971 | De Rose | 29/33 X |
| 3,736,825 | 6/1973 | Covell | 83/174 |
| 3,851,554 | 12/1974 | Papai | 83/409.2 X |
| 4,072,077 | 2/1978 | Morgan | 83/425 X |
| 4,123,876 | 11/1978 | Simmons | 83/488 X |
| 4,157,048 | 6/1979 | Lemmer | 83/580 X |
| 4,170,156 | 10/1979 | Kondo | 83/404 X |
| 4,173,160 | 11/1979 | Hess | 83/409.2 X |
| 4,200,018 | 4/1980 | Sekiwa | 83/425 |
| 4,346,506 | 8/1982 | Martindale | 83/925 R |
| 4,378,033 | 3/1983 | Fajt et al. | 140/139 |

*Primary Examiner*—James M. Meister
*Attorney, Agent, or Firm*—Fidelman, Wolffe & Waldron

[57] ABSTRACT

Lead cutting machine for cutting the leads of components mounted on printed circuit boards, this machine including a conveyor mechanism for the boards and a rotating cutting knife fixed on a carriage which is slidably mounted in a horizontal plane and under the path of the boards and which is coupled with the piston of a pneumatically controlled pressurized air cylinder.

17 Claims, 6 Drawing Figures

LEAD CUTTING MACHINE

The invention relates to a lead cutting machine for cutting the leads of components mounted on a board, said machine including a cutting device and a conveyor mechanism for moving said board with respect to said cutting device in such a manner that the latter is able to cut the leads of the components.

Such a lead cutting machine is known from French Pat. No. 2 386 962. Therein the cutting device extends in transverse direction with respect to a board moving in longitudinal direction and comprises a series of stationary knives and a set of movable knives cooperating therewith. To be able to cut a lead of a component this lead has to be introduced in the space between a stationary knife and a movable knife.

Such a machine is totally useless when the density of the leads is high as in this case at least part thereof will abut against the knives and will not be introduced between a stationary knife and a movable knife, and also when these leads are not vertical but are bent with respect to the board as often occurs in practice, for instance when the board has previously been subjected to at least one other operation, e.g. a soldering operation.

Another drawback of this known machine is that the cutting device cannot be brought in an inoperative condition, e.g. by a modification of its height, so that there is no choice to process or not to process the boards moved above the cutting device, although this may be desirable in some cases.

Still another drawback of this known machine is that the cutting device includes a large number of knives, so that the grinding thereof is time consuming as these knives have then to be removed from the machine.

An object of the invention is to provide a machine of the above type which does not present all these drawbacks.

According to the invention this object is achieved due to the fact that said cutting device includes at least one rotating cutting member, driving means coupled therewith for giving said member a rotating motion, and displacement means coupled therewith for displacing said cutting member with respect to said board.

Such a rotating cutting member is simple and is able to cut leads irrespective of the density and position of the leads with respect to the board. Because it is displaceable, the cutting member can be brought in an inoperative position and there it can be ground without having to be removed from the machine.

It should be noted that a machine with a displaceable cutting member is known per se from French patent application No. 2 394 960, but this cutting member is not constituted by a rotating knife and, moreover, during the cutting operation the board is maintained stationary and the leads to be cut have to be previously introduced into holes of a stationary lower plate.

This complicates the preparation of a cutting operation, especially when these leads were more or less bent during a preceding operation.

The above mentioned and other objects and features of the invention will become more apparent and the invention itself will be best understood by referring to the following description of embodiments taken in conjunction with the accompanying drawings wherein.

Figure 1:
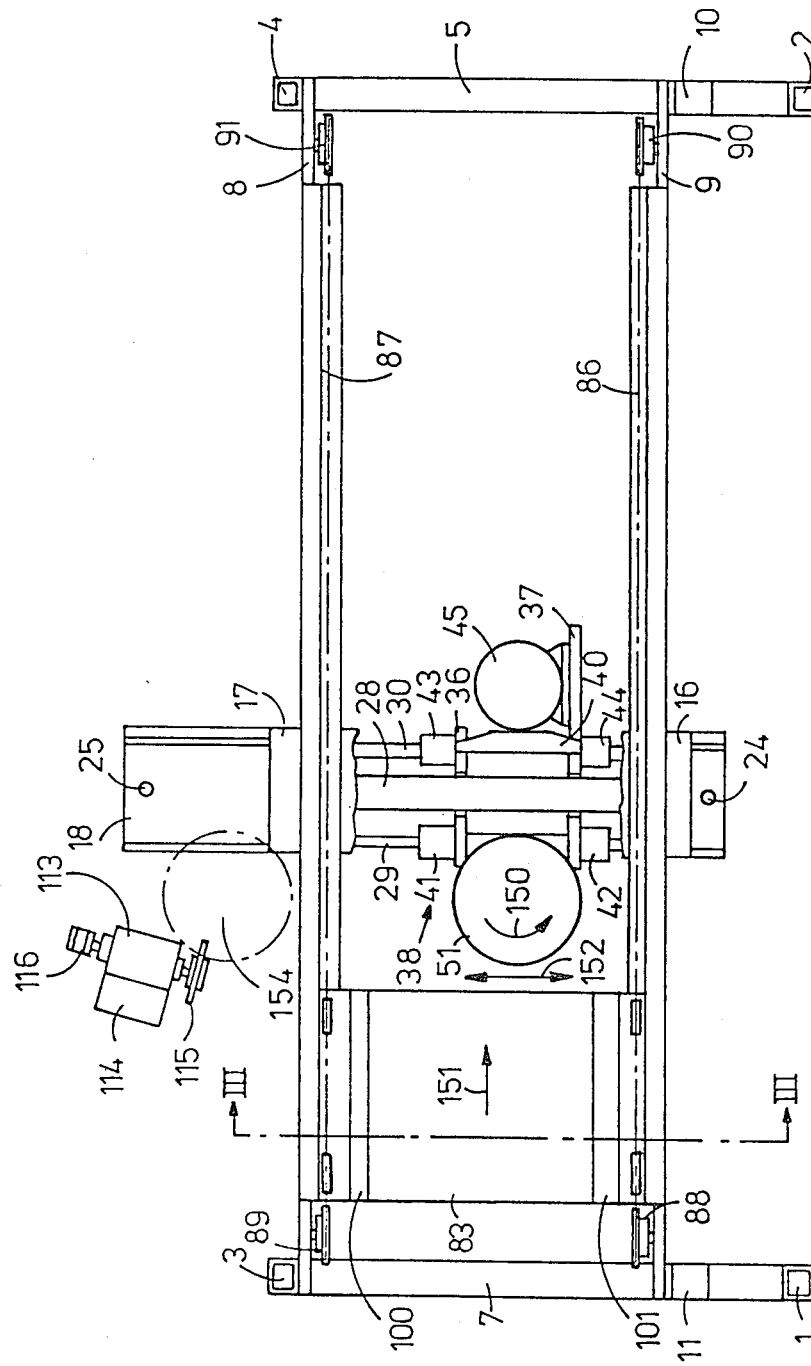
FIG. 1, FIG. 2 and FIG. 3 are a top view, a front view and a cross-section along line III—III in FIG. 1 respectively, some parts having been removed for reasons of clarity in each of these figures.

The lead cutting machine shown has a metal frame comprising two front vertical uprights 1 and 2 (FIGS. 1, 2), two rear vertical uprights 3 and 4 (FIG. 1), two lateral transverse beams 5 (FIGS. 1, 3) and 6 (FIG. 3) mounted between the uprights 2 and 4, two lateral transverse beams such as 7 (FIG. 1) mounted between the uprights 1 and 3, a rear longitudinal beam 8 (FIGS. 1, 3, 4, 5) fixed on and between the rear uprights 3 and 4, a front longitudinal beam 9 (FIGS. 1, 3, 5) fixed on and between two supports 10 and 11 (FIG. 1) which are themselves fixed on the transverse beams 5 and 7, and two longitudinal member 12 (FIG. 3) and 13 (FIGS. 2, 3) which are fixed below the lower transverse beams such as 6, and on which two transverse supports 14 (FIGS. 2, 3) and 15 (FIG. 2) are mounted.

Figure 2:
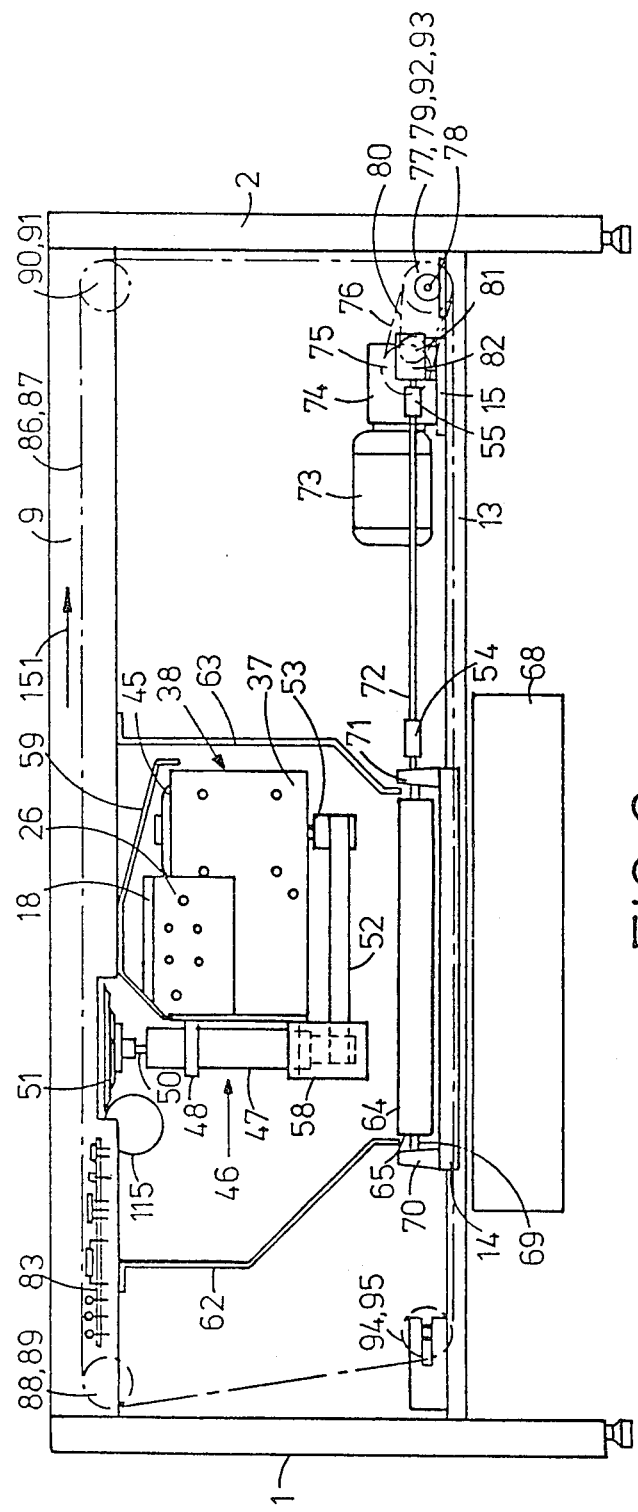
Figure 3:
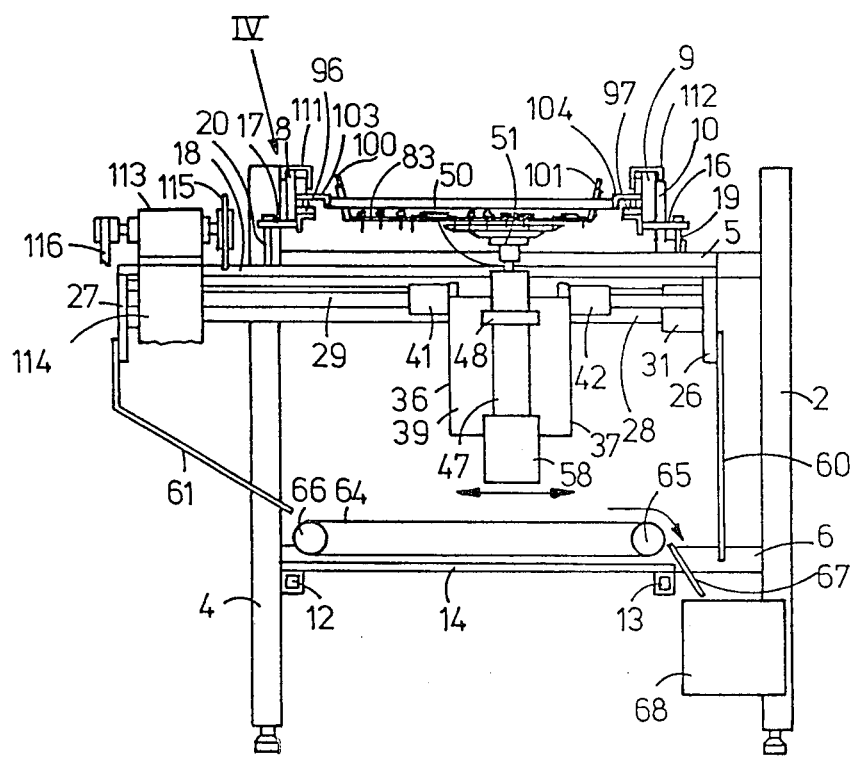

Metal strips 16 and 17 (FIGS. 1, 3) are secured to the underside of the longitudinal beams 8 and 9 and a transverse plate 18 (FIGS. 1, 2, 3, 5) is suspended therefrom by means of bolts such as 19, 20 (FIG. 3). This transverse plate 28 extends in transverse directioon with respect to the longitudinal beams 8, 9 and at both sides of these beams. A longitudinal groove 21 (FIG. 5) is made in the upper face of this transverse plate 18 and two displaceable end-of-stroke switches 22 and 23 (FIGS. 5, 6) are mounted in this groove 21. These end-of-stroke switches are for instance roller controlled valves of the type R-3-M5 of the firm FESTO and are generally available on the market. Near its ends this transverse plate 18 is provided with passages 24 (FIGS. 1, 5) and 25 (FIG. 1) for pneumatic conduits 149 and 148 (FIG. 6) respectively. Two side walls 26 (FIGS. 2, 3, 5) and 27 (FIGS. 3, 5) are secured to the ends of the transverse plate 18 and a pressurized air cylinder 28 (FIGS. 1, 3, 5, 6) and two guide rods 29 (FIGS. 1, 3, 5) and 30 (FIGS. 1, 5) parallel therewith are mounted between these side walls. The prismatic end pieces 31 (FIG. 3) and 32 (FIG. 5) of the pressurized air cylinder 28 are provided with openings, such as 33 (FIG. 5) in 32 (FIG. 5), which are coaxial with the corresponding openings 24 and 25 in the transverse plate 18.

The pressurized air cylinder 28 is of the type without piston rod of the Swedish firm ORIGA and is generally available on the market. This cylinder 28 is provided with a piston 34 (FIG. 6) coupled with an outer sliding piece 35 (FIG. 5) which is displaceable on the cylinder wall. This sliding piece 35 is secured to two parallel side walls 36 (FIGS. 1, 3, 5) and 37 (FIGS. 1, 2, 3, 5) of a carriage 38 which further includes a transverse wall 39 (FIGS. 3, 5) and a cam 40 (FIGS. 1, 5) interconnecting the two side walls 36 and 37 laterally and at their top respectively. Bearings 41, 42, 43 and 44 (FIGS. 1, 3, 5) are mounted on the side walls 36 and 37 and around the guide rods 29 and 30 due to which the carriage 38 is able to slide on these guide rods 29 and 30 and the cam 40 is able to cooperate with the pneumatic end-of-stroke switches 22 and 23. A motor 45 (FIGS. 1, 2, 5) is fixed on the side wall 37 of the carriage 38, whilst a cutting device 46 (FIGS. 2, 5) is mounted on the transverse wall 39. This device comprises a cylindrical housing 47

Figure 4:
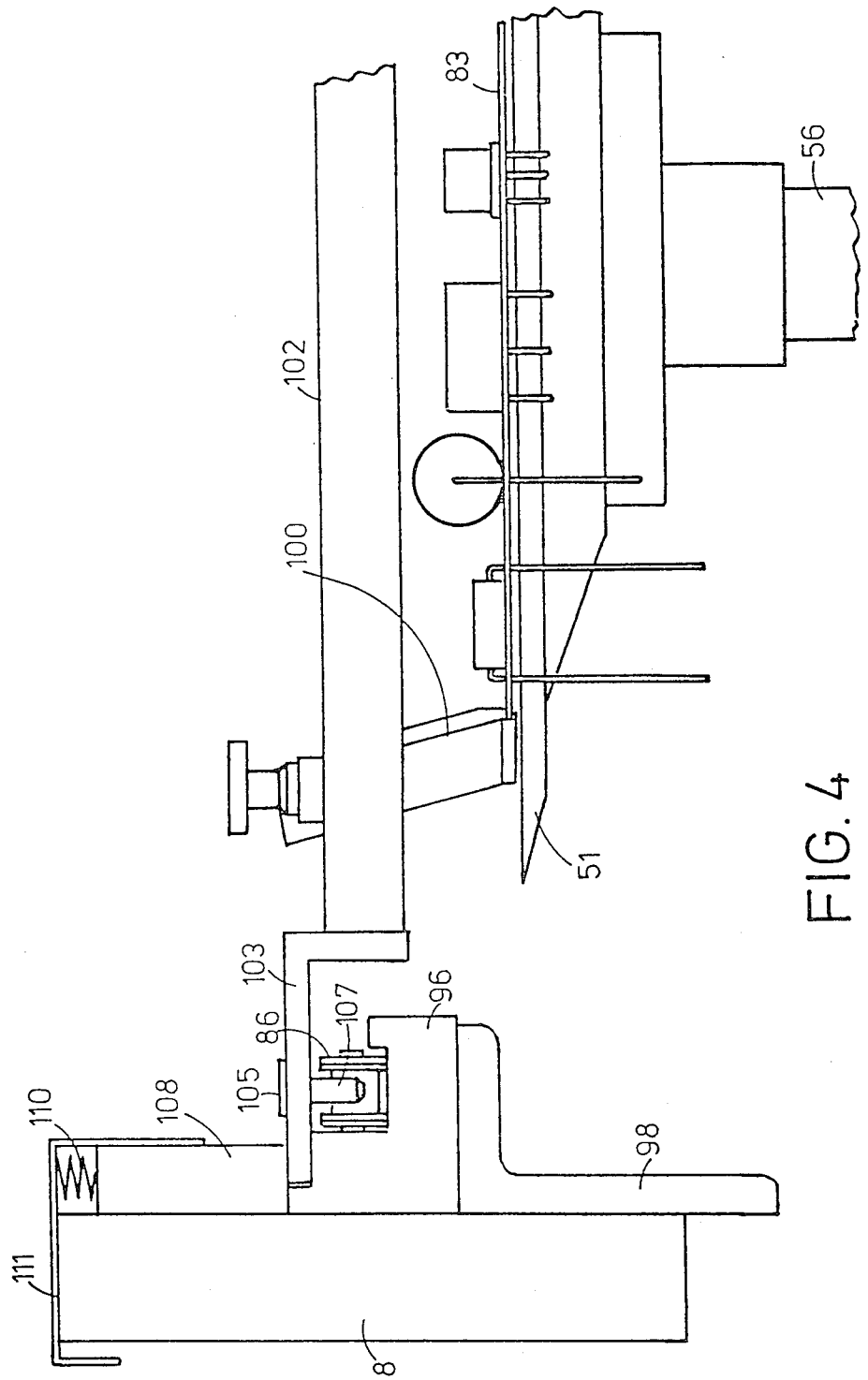
FIG. 4 is a view at an enlarged scale of part IV of FIG. 3.
Figure 5:
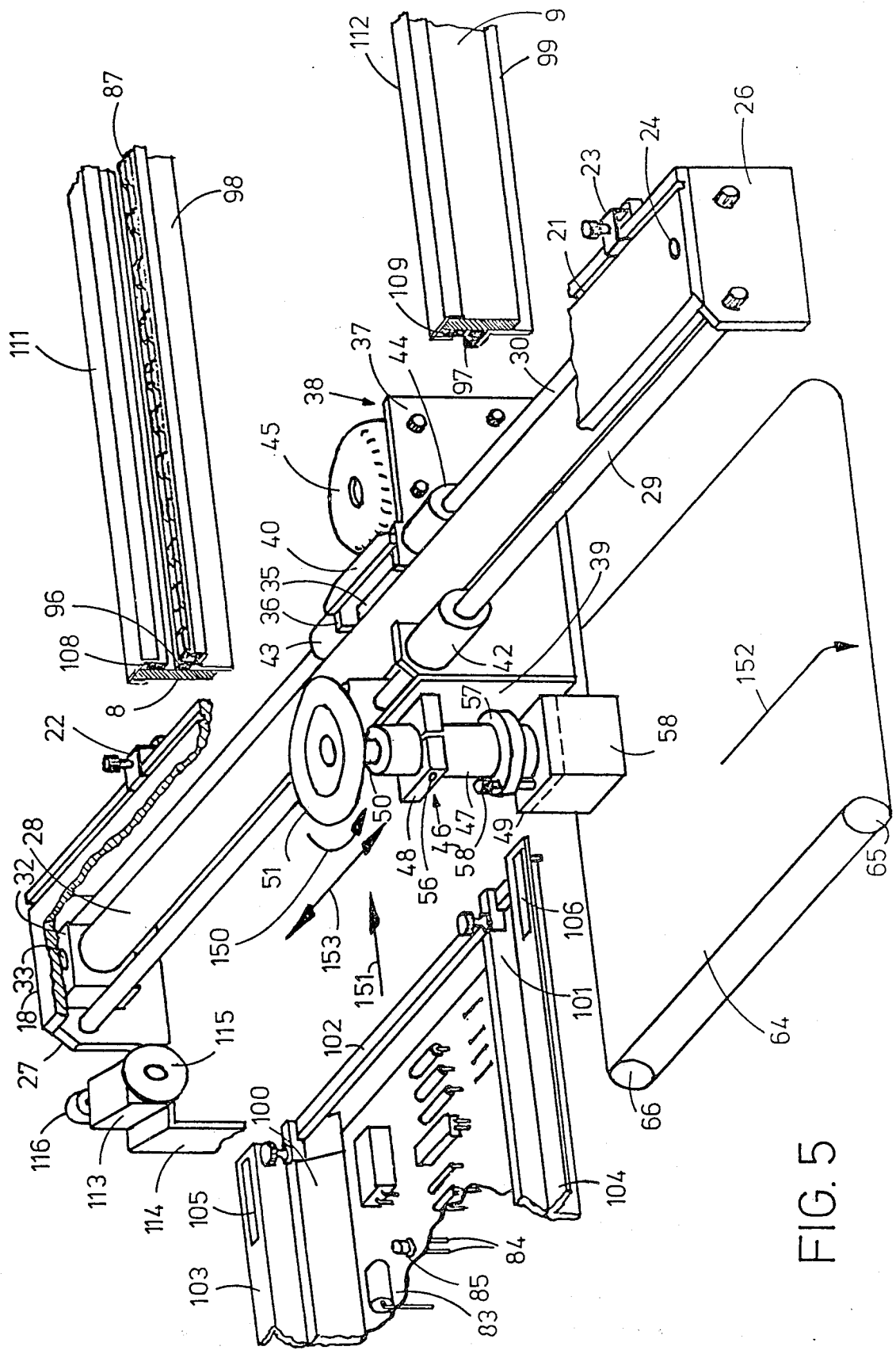
FIG. 5 is a perspective top view of part of the lead cutting machine of FIGS. 1 to 4.

(FIGS. 2, 3, 5) which is mounted on the transverse wall 39 by means of connecting pieces 48 (FIGS. 2, 3, 5) and 49 (FIG. 5) and which is provided with an axle 50 (FIGS. 2, 3, 5) on top of which a disc-shaped cutting member or cutting knife (FIGS. 1, 2, 3, 4, 5) is fixed and which at its lower end is coupled through a belt 52 (FIG. 2) with the output shaft 53 (FIG. 2) of this motor 45. The edge of this knife 51 is located in its upper face The connecting pieces 48 and 49 (FIG. 5) can be tightened by means of a screw, such as 56 (FIG. 5) for 48, and the height of the cylindrical housing 47 and therefore of the knife 51 can be adjusted by means of a stirrup 57 (FIG. 5) which is fixed on this housing 47 and by means of a regulating screw 58' (FIG. 5) the end of which rests on the upper surface of the connecting piece 49 (FIG. 5). A small shielding cap 58 (FIGS. 2, 3, 5) is mounted around this connecting piece 49 and the belt 52. Also a shielding cap 59 (FIG. 2) is fixed of the transverse plate 18 to separate the main part of the carriage 38 from the cutting device 46. Further, a part of the machine is shielded by a front shielding plate 60, (FIG. 3) fixed on the side wall 26, by a rear shielding plate 61 (FIG. 3) mounted on the side wall 27 and by two lateral shielding plates 62 and 63 (FIG. 2) An evacuating conveyor belt 64 (FIGS. 2, 3, 5) is mounted below the opening delimited by the shielding plates 60 to 63. This conveyor belt 64 comprises an endless band and is carried by two parallel rollers 65 (FIGS. 2, 3, 5) and 66 (FIGS. 3, 5). The conveyor belt is used to evacuate lead waste to a waste bin 68 (FIGS. 2, 3) via a slanting plate 67 (FIG. 3). The ends of the axes of the rollers 65 and 66 are each rotatably supported by roller bearings mounted in stirrups fixed on the transverse support 14 (FIGS. 2, 3). For instance axle 69 of roller 65 is supported by roller bearings mounted in the stirrups 70 and 71 (FIG. 3). The axle 69 of the roller 65 is prolonged sideways by the axle 72, with coupling pieces, 54, 55 (FIG. 2), driven by a drive mechanism only represented in FIG. 2. This drive mechanism includes a motor 73 with a reduction box 74 mounted on the transverse support 15 and on the output shaft of which a chain wheel 75 is fixed. This chain wheel 75 is connected by a chain 76 with a chain wheel 77 fixed on a drive shaft 78. On this drive shaft 78 is fixed another chain wheel 79 which is connected via a chain 80 with a small chain wheel 81 mounted on the input shaft of a gear box 82 the output shaft of which comprises the shaft 72 with coupling pieces 54, 55.

The machine further includes a conveyor mechanism for moving printed circuit boards, such as 83 (FIGS. 1-5), above the cutting knife 51 and to thus cut leads of components mounted on these boards, such as lead 84 (FIG. 5) of component 85 (FIG. 5). This conveyor mechanism includes two endless chains 86 and 87 (FIGS. 1, 2, 5) which are mounted in parallel vertical planes and each carried by four chain wheels 88, 89; 90, 91; 92, 93 and 94, 95, the chain wheels 92, 93 being mounted on the above mentioned drive shaft 78 which is driven by the motor 73. On a horizontal portion of their trajectory the chains 86 and 87 are slidably mounted in grooves of horizontally mounted longitudinal members 96 (FIGS. 3, 4, 5) and 97 (FIGS. 3, 5) made of a wear resistant material and supported by angle members 98 (FIGS. 4, 5) and 99 (FIG. 5) which are fixed on the longitudinal beams 8 and 9 respectively. Each of the printed circuit boards to be processed such as 23 is supported, during its displacement over the horizontal portion of the chain 86, 87, by a pair of clamping pieces 100 (FIGS. 1, 3, 4, 5) and 101 (FIGS. 1, 3, 4) mounted at either side of the board. Both these clamping pieces 100 and 101 are slidably mounted on a transverse rod 102 (FIGS. 4, 5) of a carrier so that they can serve for carrying boards of different widths. The carrier is further provided with side flanges 103 (FIGS. 3, 4, 5) and 104 (FIGS. 3, 5) and these flanges are fixed on the chains 86, 87 by means of resilient plates 105 (FIGS. 4, 5), 106 (FIG. 5), each provided with a pin, e.g. pin 107 (FIG. 4) of plate 105, engaging between two successive links of the corresponding chain, such as 86. In order to maintain the plate 83 horizontally the side flanges 103, 104 of the carriers are firmly applied against the upper face of the horizontal longitudinal members 96, 97 by pressure pieces 108, 109 (FIGS. 4, 5) which are pressed by springs, such as 110 (FIG. 4). These springs are arranged between the pressure pieces 108, 109 and caps 111, 112 (FIGS. 4, 5) mounted on top of the longitudinal beams 8 and 9.

Finally the machine is also provided with a grinding device 113 (FIGS. 1, 3, 5) mounted on a support 14 (FIGS. 1, 3, 5) and provided with a grinding disc 115 (FIGS. 1, 3, 5) coupled with a not shown drive mechanism via a drive belt 116 (FIGS. 1, 3, 5).

Figure 6:
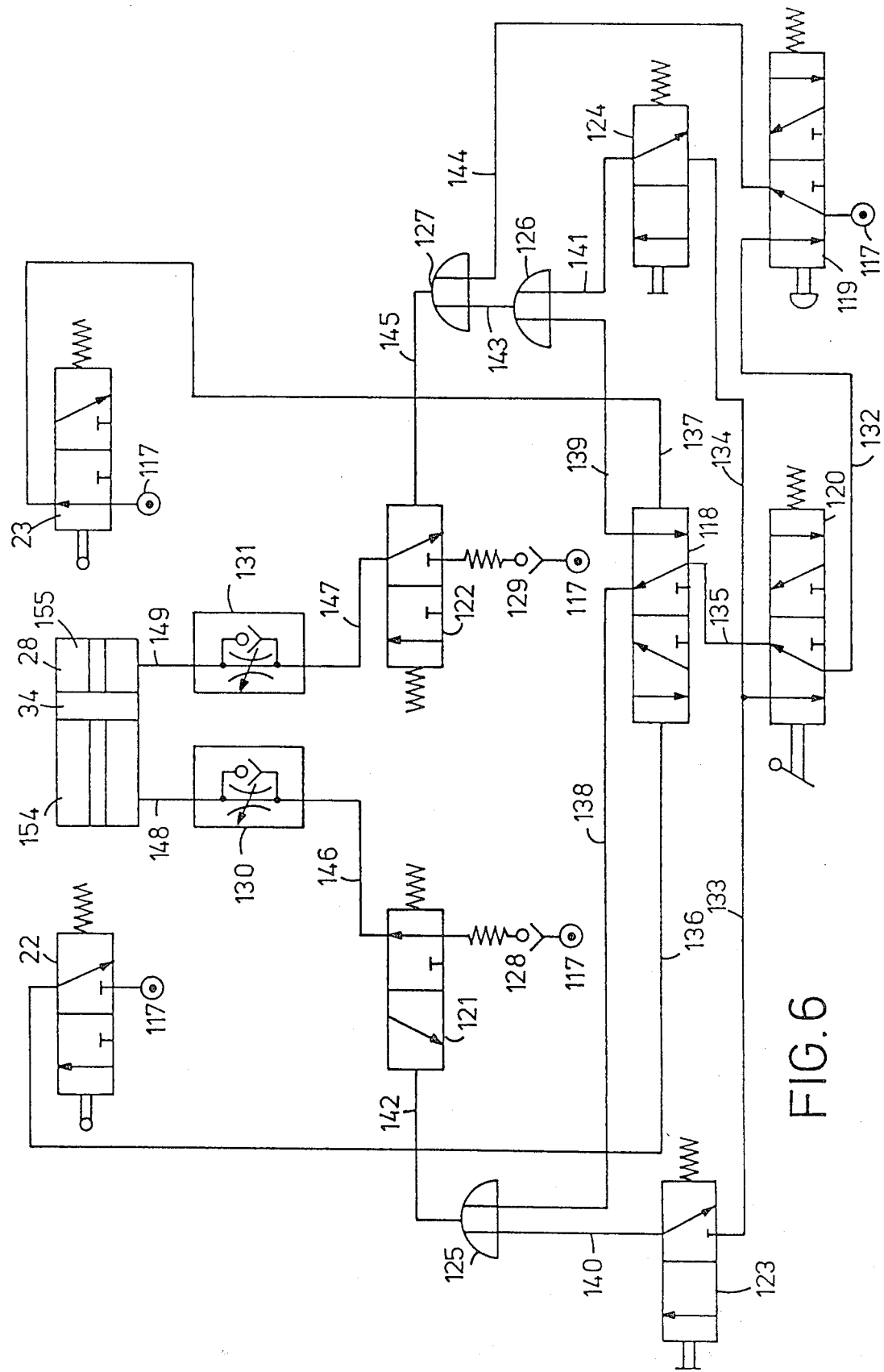
FIG. 6 is a schematic view of a pneumatic control circuit for the lead cutting machine according to FIGS. 1 to 5.

Reference is now mainly made to FIG. 6 wherein a pneumatic control circuit for the cylinder 28 with piston 34 is represented.

This circuit wherein 117 is a source of pressurized air includes:

the previously mentioned roller controlled pneumatic valves 22 and 23 which are of the type FESTO R-3-M5. These roller controlled valves are in fact monostable valves which can be brought from the rest position into the work position, against the action of a spring, by the cam 40 and which serve for adjusting the stroke of the carriage 38;

a bistable pneumatic valve 118 of the type FESTO I-5-PK3;

a pneumatic valve 119 with stop button of the type FESTO SV-5-M5-PR-22-R. This valve serves for controlling the displacement of the carriage 38 towards or from its rest position;

a pneumatic valve 120 with rotatable knob of the type FESTO 5V5-M5+N-22-S. This valve serves for giving the carriage 38 a reciprocating motion or to bring it in a predetermined position of its trajectory;

two monostable pneumatic valves 121 and 122 of the type FESTO VL/03-1/8;

two pneumatic valves 123 and 124 with push-button of the type FESTO T-3-M5. These valves intervene directly to bring the carriage 38 in a predetermined position of its trajectory;

three pneumatic OR-elements 125, 126, 127 of the type FESTO OS-PK-3-6/3;

two pneumatic check valves 128 and 129 of the type FESTO H-1/8;

two pneumatic speed regulating valves 130 and 131 of the type FESTO GR-1/8;

pneumatic conducts 132 to 149 arranged between the various above mentioned devices 22, 23, 28 and 118 to 131 which are all available on the market. Hereby the conducts 148 and 149 are couple via the openings 25 and 24 (FIG. 1) in the transverse plate 18 with connecting openings, such as 33, of the pressurized air cylinder 28.

The operation of the above described lead cutting machine is as follows.

In the rest position of the machine the valve 119 is in the position shown so that the source of pressurized air 117 is coupled via this valve 119, conduit 144, OR-element 127 and conduit 145 with the monostable valve 122 which is then brought in the work position shown. In this position the right hand chamber 155 of the cylinder 28 is exhaused via conduit 149, speed regulating valve 131, conduct 147 and monostable valve 122. Because on the other hand pressurized air is supplied to the left hand chamber 154 of the cylinder 28 from the source 117 and via check valve 128, monostable valve 121 in the rest position shown, conduit 146, speed regulating valve 130 and conduit 148, the piston 34 of the cylinder 28 is brought in its outermost right position (FIG. 6). In this position the roller controlled valve 23 is brought by the cam 40 in its work position shown. In this position pressurized air is supplied from the source 117 and via conduit 137 to the bistable valve 118 which is thus brought in its position shown. However this remains without effect as no pressurized air is supplied to the conduct 135 because valve 119 is in the position shown.

At the start of a cutting operation the motor 45 is energized due to which a rotating motion in the direction 150 (FIGS. 1,5) is given to the cutting knife 51. By energizing the motor 73 the chains 86, 87 are displaced in the direction 151 (FIGS. 1, 2, 5) so that the printed circuit board 83 is moved in the same direction. The conveyor belt 64 is moved in the direction 152 (FIG. 5).

When the valve 119 is brought in the work position by operating the stop button thereof the source of pressurized air 117 is coupled with conduit 132 and no longer with conduit 144 due to which the machine is given a reciprocating movement when the valve 120 is in the position shown, as is supposed. Indeed, with the value 119 in the work position the monostable valve 122 is exhausted and thus brought back into the rest position and the monostable valve 121 is brought in the work position by pressurized air which is supplied from the source 117 via valve 119, conduit 132, valve 120, conduit 135, valve 118, conduit 138 and OR-element 125. With the monostable valves 121 and 122 in their work and rest position respectively pressurized air is supplied to the right hand chamber 155 of the cylinder 28 from the source 117, monostable valve 122, conduit 147, speed regulating valve 131 and conduit 149 and the left hand chamber 154 of this cylinder 28 is exhausted via conduit 148, speed regulating valve 130, conduit 146 and monostable valve 121. Due to this the piston 34 and therefore also the carriage 38 is moved in the direction of the roller controlled valve 22. At the end of the stroke of this movement the valve 22 is brought in the work position by cam 40. In this work position pressurized air is supplied from the source 117 and via valve 22 and conduit 136 to bistable valve 118 which is thus brought in the other position. In this other position conduit 138 is exhausted, so that monostable valve 121 returns into its rest position wherein pressurized air is now supplied to chamber 154 of cylinder 28 from pressurized air source 117 and via check valve 128, valve 121, conduct 146, speed regulating valve 130 and conduit 148. By the bistable device 118 in the other position the monostable valve 122 is brought in the work position by means of pressurized air flowing from the pressurized air source 117, valve 119, conduit 132, valve 120, conduit 135, valve 118, conduit 139, OR-element 126, conduit 143, OR-element 127 and conduit 145. Thus the right hand chamber 155 of cylinder 28 is exhausted via conduit 149, speed regulating valve 131, conduit 147 and valve 122.

By this supply of pressurized air to chamber 54 and by the exhaustion of chamber 155 the piston 134 and therefore also the carriage 38 are now moved in the direction of the roller controlled valve 23. At the end of the stroke of this movement this valve is brought in the work position by the cam 40 due to which the bistable valve 118 is again brought in its original position and the carriage is again moved in the direction of the roller controlled valve 22, etc.

It is clear that, by the reciprocating movement of the carriage 38 in the direction of arrow 153 and below the printed circuit board 83 which is displaced by the conveyor mechanism, the leads of the components mounted on this board and protruding below this board will be cut by the rotating disc-shaped knife 51, naturally with a correct choice of the conveyor speeds of the carriage and the board, these speeds being adjustable independently from each other. Thereby the cut pieces of lead fall on the conveyor belt 64 which evacuates them into the waste bin 69 and the various shielding parts 58-63 prevent the machine from being soiled by such lead bits.

To modify the stroke of the reciprocating movement of the carriage 38 and therefore of the cutting knife 51 it is sufficient to change the position of the regulating valves 22 and 23. Thus the machine can be adapted in a simple way to process printed circuit boards of different widths. Hereby the size of the cutting knife plays no role.

Instead of communicating to the carriage 38 a reciprocating movement, it can also be brought in a predetermined position of its trajectory and this position can be located either below or outside the trajectory followed by the board 83.

To this end it is sufficient to operate one of the valves 123 and 124.

When the carriage 38 is for instance in the above mentioned rest position, because valve 119 is in the rest position shown, and should be moved in the direction of regulating valve 22, first the rotatable knob of valve 120 is brought in another position than in the one shown and valve 119 is brought in the work position. In this position of the valve 120 the source of pressurized air 117 is now connected with the conduits 133 and 134 via valve 119, conduit 132 and valve 120 and conduit 135 is exhausted and in this position of valve 119 conduit 144 is exhausted due to which the monostable valve 122 is brought back into its rest position. In this position pressurized air is supplied to the right hand chamber 155 of the cylinder 28, but this remains temporarily without influence.

Valve 123 is then operated and brought in the work position. Due to this, pressurized air is supplied to monostable valve 121 via OR-element 125, this valve 121 being thus brought in the work position so that chamber 154 of cylinder 28 is exhausted. As a consequence piston 34, and therefore also carriage 38, moves in the direction of valve 22 as long as valve 123 is operated. The cutting knife 51 can thus be brought in any position of its trajectory. This movement is independent from valve 22 because when this valve is at a certain moment operated by cam 40 of carriage 38 the bistable valve 118 is brought in another position, but this has no further influence because no pressurized air is supplied to the conduit 135. In other words, by operating the valve 123 the carriage 38 can also be brought in an inoperative position beyond the position of valve 22 and outside the trajectory of the board 83. More particularly the cutting knife 51 can thus be moved in an inoperative position 154' (FIG. 1) in the proximity of the grinding disc 115. In this inoperative position the cutting knife 51 is easily accessible and can be cleaned and ground by means of the grinding disc 115 in a simple and safe way, without hindering the operation of the other parts of the machine. Also the grinding disc 115 can be sharpened.

In an analoguous way the carriage 38 and therefore also the cutting knife 51 can be moved in the other direction, i.e. in the direction of valve 23, by operating the valve 124.

It is also clear that leads of printed circuit boards, such as 83, can also be cut with the rotating knife 51 in a stationary position with respect to the moving board 83.

Due to the fact that the cutting knife 51 can also be brought in a position located outside the trajectory followed by the board 83, i.e. in a position wherein this cutting knife 51 is inoperative, such boards can in a selective way be processed or not. Obviously hereby one has to take into account the time required to bring the knife in this position and the distance between the boards.

It should be noted that the cutting knife 51 can be brought in an inoperative position only by a displacement outside the trajectory of the boards 83 and without the height position of this knife having to be changed. Such a change of height of the cylindrical housing 47 of this knife can be performed by means of the adjusting screw 58' and after the screws, such as 56, of the connecting pieces 48 and 49 have been unscrewed. This change of height is however only required to change the length of lead to be cut. The minimum length to be cut can be chosen very small because the edge of the knife is located in the upper surface thereof.

The machine can also include supporting brushes to prevent the printed circuit boards from sagging just before they are processed by the cutting knife. This is done in order to prevent the cutting knife from cutting into the boards. Further, a brush unit can also be provided to remove lead waste sticking to the boards after a cutting operation has been performed. These boards are then removed from the chains in a way not shown.

While the principles of the invention have been described above in connection with specific apparatus, it is to be clearly understood that this description is made only by way of example and not as a limitation on the scope of the invention.

We claim:

1. An apparatus for trimming component leads protruding from a surface of a circuit board, and comprising:
   means for conveying said circuit board along a line of feed;
   cutter means comprising at least one rotary cutting disc having a rotation axis;
   means for displacing said cutter means laterally across said line of feed to effect said lead trimming during said conveying, wherein said cutting disc is generally parallel to said circuit board surface during said displacing and trimming; and
   means for independently adjusting speeds of said conveying means and said displacing means.

2. Lead cutting machine according to claim 1, characterized in that said cutter means and said driving means are mounted on a displaceable carriage which is slidably mounted on two parallel rods and that said displacement means include a pressurized air cylinder which is mounted in parallel with said rods and the piston of which is coupled with said carriage.

3. Lead cutting machine according to claim 2, characterized in that said piston is coupled with an outer sliding piece displaceable on the cylinder wall of the pressurized air cylinder.

4. Lead cutting machine according to claim 1, characterized in that said cutter means comprises a cutting disc a cutting edge of which is located in an upper face of the disc.

5. Lead cutting machine according to claim 1, characterized in that said cutter means comprises a cutting disc mounted on an axle and that said driving means comprise a motor having a shaft which is coupled with said axle.

6. Lead cutting machine according to claim 2, characterized in that said adjusting means comprise a cam mounted on said carriage and end-of-stroke switches cooperating with said cam, the position of said switches being adjustable and said switches forming part of a pneumatic control circuit for said pressurized air cylinder.

7. Lead cutting machine according to claim 6, characterized in that said pneumatic control circuit includes two pneumatic first monostable valves which constitute said end-of-stroke switches and control a pneumatic first bistable valve which itself controls two pneumatic second monostable valves which control supply and exhaust of pressurized air to and from cylinder chambers of the cylinder.

8. Lead cutting machined according to claim 7, characterized in that said pneumatic control circuit further includes two pneumatic push-button controlled third monostable valves which also control said pneumatic second monostable valves, and that there is further provided a pneumatic push-button controlled second bistable valve to selectively prepare operation either of the pneumatic bistable valve or of the pneumatic third monostable valves.

9. Lead cutting machine according to claim 8, characterized in that speed regulating valves are mounted between said first monostable valves and said pressured air cylinder.

10. Lead cutting machine according to claim 1, characterized in that an evacuation conveyor belt is mounted below a trajectory of the displacement means, said conveyor belt being adapted to evacuate cut lead waste to a waste bin.

11. Lead cutting machine according to claim 10, characterized in that shield plates are mounted around the trajectory of the displacement means and delimit at their lower end an opening below which said evacuation conveyor belt is mounted.

12. Lead cutting machine according to claim 5, characterized in that said motor, said rods and said pressurized air cylinder are separated from said cutter means by a shield cap.

13. Lead cutting machine according to claim 1, characterized in that other adjusting means are provided to adjust a height of said cutter means with respect to a trajectory of said conveying means.

14. Lead cutting machine according to claim 1, characterized in that said conveying means includes a pair of parallel running chains between the links of which flanges of carriers of said board are removably secured, that said chains are located during at least part of said conveying in wear resistant members, and that said flanges are pressed against said wear resistant members by resilient pressure pieces.

15. An apparatus as in claim 1, and further comprising:
   means for guiding said cutter means during said displacing, and
   means for adjustably setting limits of said displacing.

16. An apparatus as in claim 1, wherein said cutter means displacing is in a direction substantially perpendicular to said line of feed.

17. An apparatus as in claim 1, and further comprising:
   means for grinding said cutter means, said grinding means located outside a feed path of said circuit board; and
   means for controlling said displacing means such that said cutter means is positionable relative to said grinding means for said grinding, upon command.

* * * * *